(12) United States Patent
Kukimiya et al.

(10) Patent No.: US 9,780,807 B2
(45) Date of Patent: Oct. 3, 2017

(54) DATA PROCESSING APPARATUS, DATA PROCESSING METHOD, AND NON-TRANSITORY COMPUTER READABLE MEDIUM

(71) Applicant: FUJI XEROX CO., LTD., Tokyo (JP)

(72) Inventors: Ryo Kukimiya, Kanagawa (JP); Junichi Okuyama, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/251,691

(22) Filed: Aug. 30, 2016

(65) Prior Publication Data

US 2017/0257114 A1   Sep. 7, 2017

(30) Foreign Application Priority Data

Mar. 1, 2016 (JP) ................. 2016-038552

(51) Int. Cl.
*H03M 7/40* (2006.01)
*H03M 7/46* (2006.01)
*H03M 7/30* (2006.01)

(52) U.S. Cl.
CPC ............... *H03M 7/46* (2013.01); *H03M 7/40* (2013.01); *H03M 7/6005* (2013.01); *H03M 7/6064* (2013.01)

(58) Field of Classification Search
CPC ........ H03M 7/46; H03M 7/40; H03M 7/6064; H03M 7/6005
USPC .......................................... 341/59
See application file for complete search history.

(56) References Cited

U.S. PATENT DOCUMENTS

| | | | |
|---|---|---|---|
| 7,330,137 B2* | 2/2008 | Liu ........... | H03M 5/145 341/50 |
| 7,385,533 B2* | 6/2008 | Sawada ......... | H03M 5/145 341/51 |
| 7,565,024 B2* | 7/2009 | Golla .......... | H04N 19/647 382/232 |
| 8,724,913 B2* | 5/2014 | Du ............. | H04N 19/176 341/50 |

FOREIGN PATENT DOCUMENTS

JP       2011-055422 A    3/2011

* cited by examiner

*Primary Examiner* — Brian Young
(74) *Attorney, Agent, or Firm* — Sughrue Mion, PLLC

(57) ABSTRACT

A data processing apparatus includes a circuit selecting unit and a decoding processor. The circuit selecting unit selects a decoder circuit for each data part of encoded target data. The decoder circuit is suitable for an arrangement of run lengths in the data part. The decoding processor performs reconfiguration to form the decoder circuit selected for the data part, and decodes the target data.

19 Claims, 12 Drawing Sheets

FIG. 2
(1) EXEMPLARY DATA 1
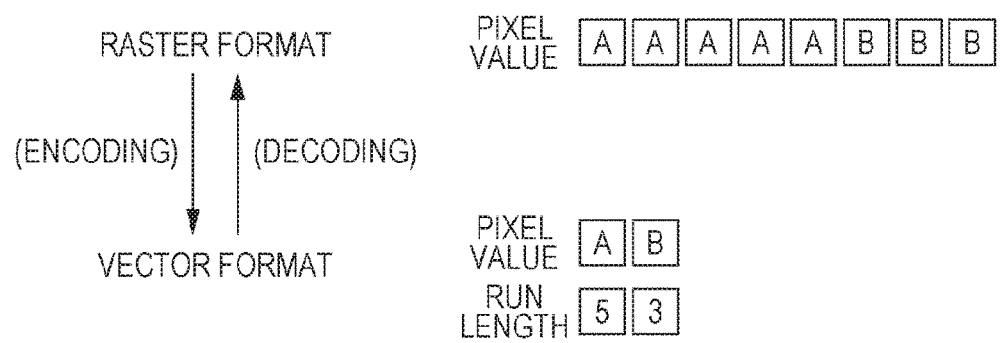
(2) EXEMPLARY DATA 2
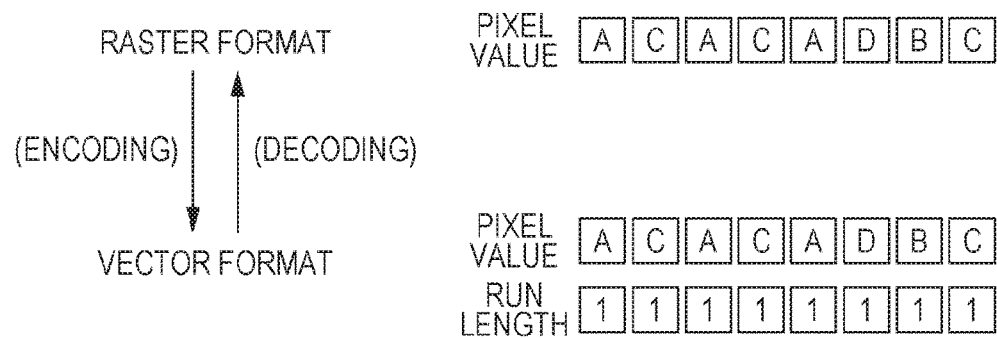

DATA PROCESSING APPARATUS, DATA PROCESSING METHOD, AND NON-TRANSITORY COMPUTER READABLE MEDIUM

CROSS-REFERENCE TO RELATED APPLICATIONS

This application is based on and claims priority under 35 USC 119 from Japanese Patent Application No. 2016-038552 filed Mar. 1, 2016.

BACKGROUND

Technical Field

The present invention relates to a data processing apparatus, a data processing method, and a non-transitory computer readable medium.

SUMMARY

According to an aspect of the invention, there is provided a data processing apparatus including a circuit selecting unit and a decoding processor. The circuit selecting unit selects a decoder circuit for each data part of encoded target data. The decoder circuit is suitable for an arrangement of run lengths in the data part. The decoding processor performs reconfiguration to form the decoder circuit selected for the data part, and decodes the target data.

BRIEF DESCRIPTION OF THE DRAWINGS

Exemplary embodiment of the present invention will be described in detail based on the following figures, wherein:

FIG. 2 is a diagram illustrating exemplary encoding and decoding of target data;

DETAILED DESCRIPTION

Figure 1:
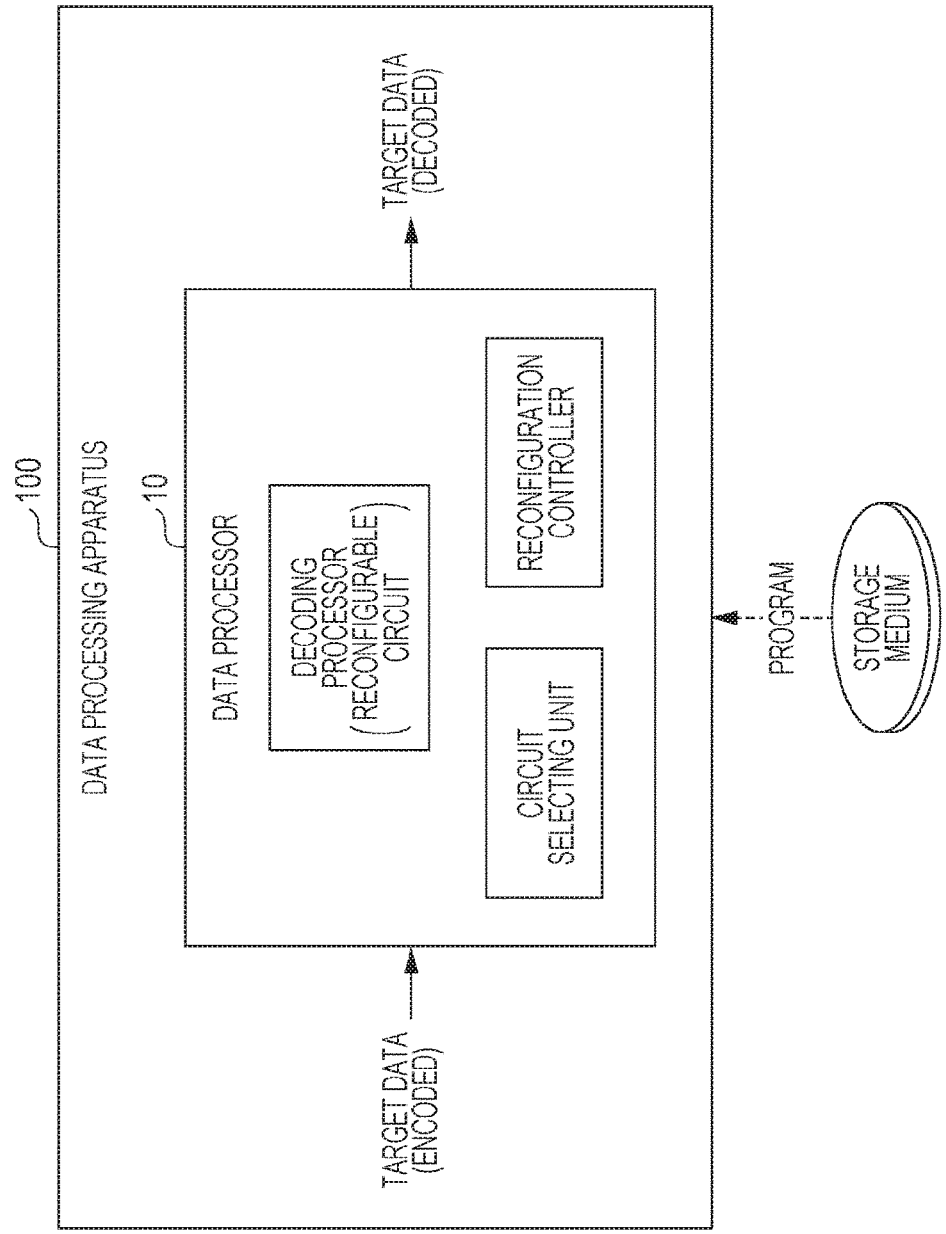
FIG. 1 is a diagram illustrating an exemplary data processing apparatus desirable for an exemplary embodiment of the present invention.

FIG. 1 is a diagram illustrating an exemplary data processing apparatus 100 that is desirable for an exemplary embodiment for carrying out the present invention. The data processing apparatus 100 in FIG. 1 includes a data processor 10 which performs data processing on target data (data to be processed).

A desirable example of the target data which is to be processed by the data processing apparatus 100 in FIG. 1 is image data (including data containing only characters, numbers, and symbols) or the like. For example, image data is transmitted from an external apparatus such as a computer to the data processing apparatus 100.

Alternatively, the data processing apparatus 100 in FIG. 1 may be integrated into an image processing apparatus provided with an image reading function (scan function) and the like, and image data obtained from a medium such as paper by using the image reading function may be used as the target data. Further, an image corresponding to image data obtained after processing performed by the data processing apparatus 100 may be printed on paper or the like, or image data obtained after the processing may be supplied to an external apparatus. Desirable examples of the image processing apparatus include a copier, a printer, and a facsimile (fax). Further, a multi-function device provided with multiple functions that are among a copier function, a printer function, and a facsimile function is also a desirable example of the image processing apparatus.

The data processor 10 performs data processing on the target data. In the example illustrated in FIG. 1, the data processor 10 includes a decoding processor, a circuit selecting unit, and a reconfiguration controller. The target data which has been encoded is decoded, and the decoded data is obtained. The circuit configuration of the decoding processor is implemented by using a programmable and reconfigurable circuit. The circuit selecting unit selects a decoder circuit that is to be formed through reconfiguration in the decoding processor. The reconfiguration controller controls reconfiguration of the decoding processor (reconfigurable circuit) so that the decoder circuit selected by the circuit selecting unit is formed through the reconfiguration.

A reconfigurable circuit is a circuit for which the internal circuit configuration is reconfigurable (programmable). For example, a dynamic reconfigurable processor (DRP) is one of desirable devices as a reconfigurable circuit. As a matter of course, another device, for example, a programmable logic circuit, such as a programmable logic device (PLD) or a field programmable gate array (FPGA), may be used as a reconfigurable circuit. Further, a dynamically reconfigurable device (processor or the like) which will be available in the future may be used to implement a reconfigurable circuit.

At least part of the internal configuration provided for the data processing apparatus 100 in FIG. 1 may be constituted, for example, by hardware for implementing a calculation function and the like, and software (such as control programs) defining operations of the hardware, and may be implemented through collaboration between the hardware and the software. For example, the functions of the circuit selecting unit and the reconfiguration controller in the data processor 10 may be implemented by using a computer. In this case, for example, programs for implementing an algorithm which corresponds to the functions of the circuit selecting unit and the reconfiguration controller and which is described in detail below are stored in a computer-readable storage medium, such as a disk or a memory, and are supplied to a computer (data processing apparatus 100) via the storage medium. As a matter of course, the programs may be supplied to a computer through a telecommunication line such as the Internet. The hardware resource, such as a central processing unit (CPU) and a memory, which is included in the computer collaborates with the supplied programs (software), whereby, for example, the functions of the circuit selecting unit and the reconfiguration controller are implemented.

The overall configuration of the data processing apparatus 100 in FIG. 1 is described above. Exemplary processes or functions implemented by the data processing apparatus 100 will be described. For the configuration (units denoted by reference numerals) illustrated in FIG. 1, the reference numerals in FIG. 1 are used in the description below.

FIG. 2 is a diagram illustrating exemplary encoding and decoding of the target data. FIG. 2 illustrates data formats of image data which is a desirable example of the target data processed by the data processing apparatus 100. That is, exemplary image data in raster format and exemplary image data in vector format are illustrated. Processing of converting image data from raster format to vector format is exemplary encoding. Processing of converting image data from vector format to raster format is exemplary decoding.

Image data in raster format has a data structure in which the pixel values of multiple continuous pixels in the image data are arranged in the order of the arrangement of the pixels. In contrast, image data in vector format is constituted by combinations of a pixel value and its run length, each of which describes multiple pixels. A run length in vector format indicates the number of continuous pixels having the same pixel value in image data. That is, a combination of a pixel value and its run length indicates that pixels, the number of which is equal to the run length and which correspond to the pixel value, are continuously arranged.

For example, exemplary data 1 describes image data in which the pixel values of multiple continuous pixels are AAAAABBB from the left. In raster format, according to the arrangement in the image data, the pixel values of multiple pixels are arranged as AAAAABBB from the left. In contrast, in vector format, multiple continuous pixels having the same pixel value are combined together into a combination of the pixel value and its run length. In exemplary data 1, five pixels having a pixel value of A are continuously arranged, and three pixels having a pixel value of B are continuously arranged. In vector format, the data has a structure of the pixel value A×a run length of 5 and the pixel value B×a run length of 3.

Exemplary data 2 describes image data in which the pixel values of multiple continuous pixels are ACACADBC from the left. In raster format, according to the arrangement in the image data, the pixel values of multiple pixels are arranged as ACACADBC from the left. In contrast, in vector format, multiple continuous pixels having the same pixel value are combined together into a combination of the pixel value and its run length. In exemplary data 2, since continuous pixels having the same pixel value are not present, the pixel values of the multiple pixels have failed to be compressed and still remain ACACADBC from the left in vector format.

The data processor 10 (FIG. 1) decodes the target data which has been encoded, and the decoded data is obtained. For example, the data processor 10 decodes image data in vector format into image data in raster format.

Figure 3:
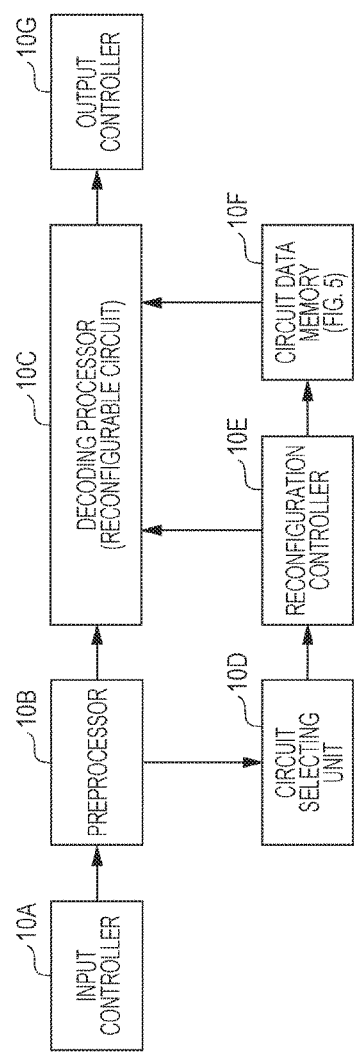
FIG. 3 is a diagram illustrating a data processor of a first example.

FIG. 3 is a diagram illustrating the data processor 10 of a first example. FIG. 3 illustrates an exemplary internal configuration of the data processor 10.

An input controller 10A obtains the encoded target data, e.g., image data in vector format. For example, the input controller 10A sequentially obtains image data constituted by multiple lines, from the top line.

A preprocessor 10B converts the encoded target data obtained from the input controller 10A, into intermediate code in which the total of run lengths matches the output width for a decoding processor 10C. The decoding processor 10C decodes the target data which has been converted into the intermediate code, thereby obtaining the decoded target data.

Figure 4:
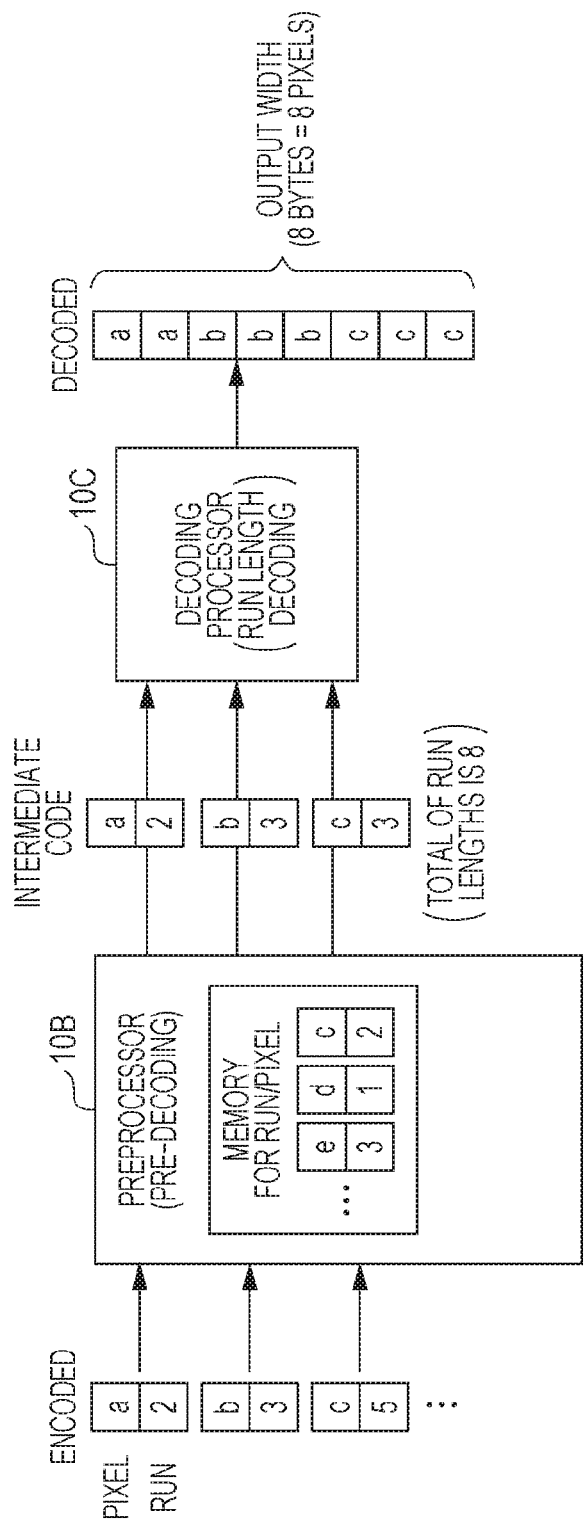
FIG. 4 is a diagram illustrating exemplary processing performed by a preprocessor and a decoding processor.

FIG. 4 is a diagram illustrating an exemplary process performed by the preprocessor 10B and the decoding processor 10C. The preprocessor 10B sequentially obtains the encoded target data, e.g., image data in vector format, from the top line, and converts (pre-decodes) the obtained data into the intermediate code in which the total of run lengths matches the output width for the decoding processor 10C.

In the example of FIG. 4, the output width for the decoding processor 10C is eight bytes corresponding to eight pixels. The decoding processor 10C sequentially outputs image data which has been decoded into raster format, from the top line in the unit of 8 pixels. Therefore, in the example in FIG. 4, the preprocessor 10B generates intermediate codes in the unit of 8 pixels which correspond to the output width for the decoding processor 10C.

For example, as illustrated in FIG. 4, upon reception of image data in vector format which has been encoded into a code constituted by a pixel value of a×a run length of 2, a pixel value of b×a run length of 3, and a pixel value of c×a run length of 5, the preprocessor 10B generates an intermediate code which corresponds to eight pixels constituted by the pixel value a×a run length of 2, the pixel value b×a run length of 3, the pixel value c×a run length of 3, that is, in which the total of the run lengths is eight. The remaining run length of 2 for the pixel value c is used in an intermediate code for the next eight pixels. In the example in FIG. 4, the preprocessor 10B sequentially generates intermediate codes, each of which corresponds to eight pixels and in each of which the total of the run lengths is eight.

The decoding processor 10C decodes (performs run-length decoding on) the image data in vector format which has been converted into the intermediate code corresponding to eight pixels, thereby outputting image data in raster format in the unit of 8 pixels. The decoding processor 10C expands the pixel value of each pixel included in the image data which is in vector format and which is an intermediate code, multiple times, the number of which is equal to the run length for the pixel, and converts (rasterizes) image data into raster format.

Referring back to FIG. 3, the decoding processor 10C which is implemented by using a reconfigurable circuit forms, through reconfiguration, a decoder circuit selected for each intermediate code corresponding to eight pixels, and performs decoding. A decoder circuit to be formed through reconfiguration in the decoding processor 10C is selected by a circuit selecting unit 10D.

The circuit selecting unit 10D selects a decoder circuit for each intermediate code corresponding to eight pixels, from among multiple dedicated circuits which output processing results having the same output width, e.g., an 8-pixel width in the example in FIG. 4. A reconfiguration controller 10E controls reconfiguration performed by the decoding processor 10C. Circuit data used in reconfiguration performed by the decoding processor 10C is stored in a circuit data memory 10F.

Figure 5:
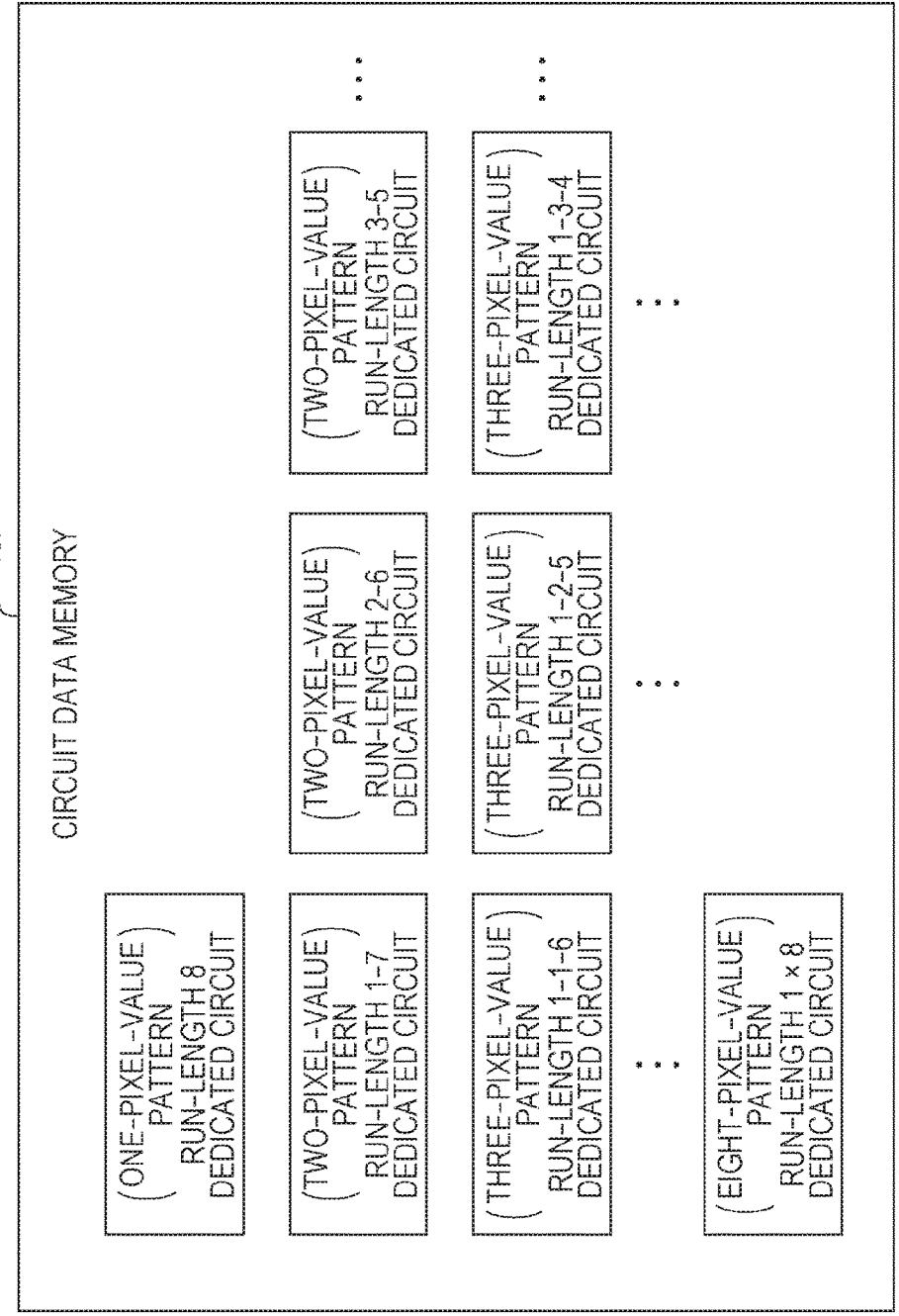
FIG. 5 is a diagram illustrating circuit data of the first example which is stored in a circuit data memory.

FIG. 5 is a diagram illustrating circuit data of the first example which is stored in the circuit data memory 10F. In the circuit data memory 10F, circuit data for multiple dedicated circuits, each of which is prepared for a corresponding one of the combinations of run lengths whose total is eight (the output width for the decoding processor 10C), is stored.

For example, a run-length 8 dedicated circuit corresponds to circuit data of a dedicated circuit corresponding to an intermediate code constituted by one pixel value (one-pixel-value pattern). In the case where intermediate codes are formed in the unit of 8 pixels (the example in FIG. 4), if an intermediate code is constituted by one pixel value, the intermediate code has a structure of the one pixel value×a run length of 8.

For an intermediate code constituted by two pixel values (two-pixel-value pattern), multiple pieces of circuit data corresponding to a run-length 1-7 dedicated circuit, a run-length 2-6 dedicated circuit, a run-length 3-5 dedicated circuit, etc. are stored. The run-length 1-7 dedicated circuit corresponds to an intermediate code constituted by two pixel values of a run length of 1 and a run length of 7. The run-length 2-6 dedicated circuit corresponds to an intermediate code constituted by two pixel values of a run length of 2 and a run length of 6. For an intermediate code constituted by two pixel values (two-pixel-value pattern), circuit data for multiple dedicated circuits, each of which is prepared for a corresponding one of the combinations of two run lengths whose total is eight, is stored.

For an intermediate code constituted by three pixel values (three-pixel-value pattern), multiple pieces of circuit data corresponding to a run-length 1-1-6 dedicated circuit, a run-length 1-2-5 dedicated circuit, a run-length 1-3-4 dedicated circuit, etc. are stored. The run-length 1-1-6 dedicated circuit corresponds to an intermediate code constituted by three pixel values of a run length of 1, a run length of 1, and a run length of 6. The run-length 1-2-5 dedicated circuit corresponds to an intermediate code constituted by three pixel values of a run length of 1, a run length of 2, and a run length of 5. For an intermediate code constituted by three pixel values (three-pixel-value pattern), circuit data for multiple dedicated circuits, each of which is prepared for a corresponding one of the combinations of three run lengths whose total is eight, is stored.

Similarly, for an intermediate code constituted by four pixels values (four-pixel-value pattern), an intermediate code constituted by five pixel values (five-pixel-value pattern), an intermediate code constituted by six pixel values (six-pixel-value pattern), and an intermediate code constituted by seven pixel values (seven-pixel-value pattern), circuit data for multiple dedicated circuits, each of which is prepared for a corresponding one of the combinations of run lengths whose total is eight, is stored.

For an intermediate code constituted by eight pixel values (eight-pixel-value pattern), circuit data corresponding to a run-length 1×8 dedicated circuit in which all of the run lengths are equal to one is stored. In the case where intermediate codes are formed in the unit of 8 pixels (the example in FIG. 4), if an intermediate code is constituted by eight pixel values, the run lengths of all of the eight pixels are equal to one.

Referring back to FIG. 3, for each intermediate code which corresponds to eight pixels and which is generated by the preprocessor 10B, the circuit selecting unit 10D selects a dedicated circuit corresponding to the intermediate code. For example, if a combination of run lengths constituting an intermediate code corresponding to eight pixels is constituted by run lengths 2, 3, and 3 (see the example in FIG. 4), a run-length 2-3-3 dedicated circuit is selected as a dedicated circuit corresponding to the intermediate code.

The reconfiguration controller 10E controls reconfiguration performed by the decoding processor 10C, in such a manner that the dedicated circuit selected by the circuit selecting unit 10D is formed. The decoding processor 10C decodes the intermediate code by using the decoder circuit (dedicated circuit) formed through the reconfiguration. Thus, for example, if a combination of run lengths constituting the intermediate code is constituted by run lengths 2, 3, and 3, the run-length 2-3-3 dedicated circuit is formed through reconfiguration in the decoding processor 10C. The intermediate code of run lengths 2, 3, and 3 is decoded by using the run-length 2-3-3 dedicated circuit.

An output controller 10G controls output of a processing result obtained from the decoding processor 10C. The output controller 10G sequentially outputs the decoded target data obtained from the decoding processor 10C, e.g., image data which has been decoded into raster format, from the top line in the unit of the output width for the decoding processor 10C, i.e., in the unit of 8 pixels (for every eight bytes) in the example in FIG. 4.

In the first example in FIG. 3, a dedicated circuit associated with a combination of run lengths constituting an intermediate code is selected from multiple dedicated circuits, each of which is prepared for a corresponding one of the combinations of run lengths. The selected dedicated circuit is used to decode the intermediate code. Since, for each intermediate code corresponding to eight pixels, a dedicated circuit for the intermediate code is simply formed through reconfiguration, the circuit size is smaller than that for a case in which all of the dedicated circuits corresponding to all of the combinations of run lengths are formed as fixed circuits.

Figure 6:
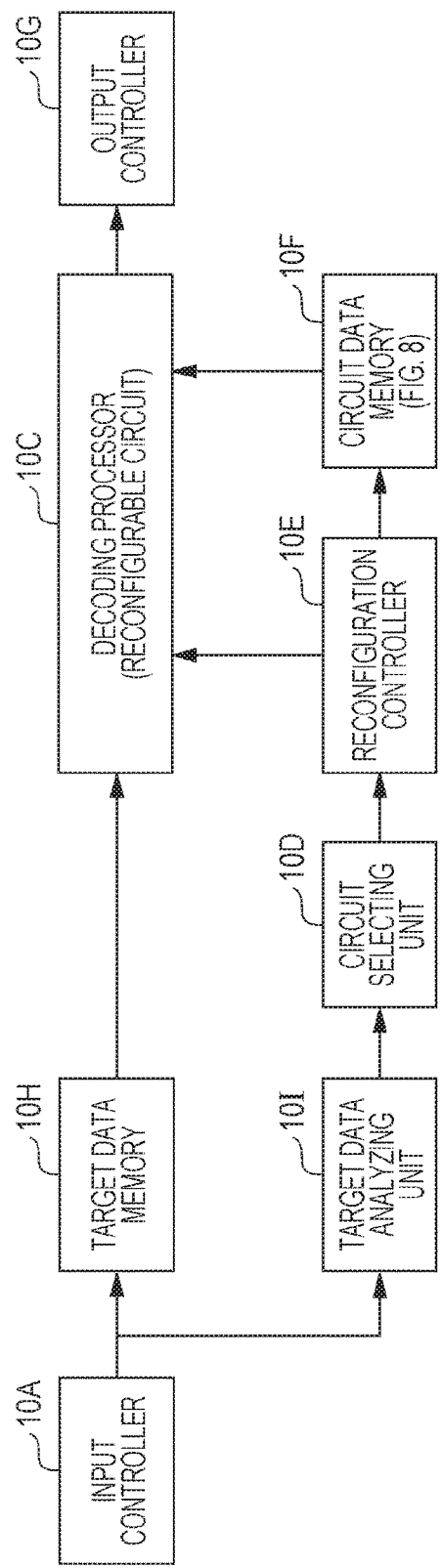
FIG. 6 is a diagram illustrating a data processor of a second example.

FIG. 6 is a diagram illustrating the data processor 10 of a second example. FIG. 6 illustrates an exemplary internal configuration of the data processor 10.

The input controller 10A obtains the encoded target data, e.g., image data in vector format. For example, the input controller 10A sequentially obtains image data constituted by multiple lines, from the top line. The encoded target data obtained by the input controller 10A is stored in a target data memory 10H. The encoded target data obtained by the input controller 10A is transmitted to a target data analyzing unit 10I.

The target data analyzing unit 10I analyzes the arrangement of run lengths in the encoded target data. The circuit selecting unit 10D selects a decoder circuit suitable for the arrangement of run lengths on the basis of the analysis result obtained by the target data analyzing unit 10I. The reconfiguration controller 10E controls reconfiguration performed by the decoding processor 10C, in such a manner that the decoder circuit selected by the circuit selecting unit 10D is formed. The decoding processor 10C which is implemented by using a reconfigurable circuit forms, through reconfiguration, the decoder circuit selected by the circuit selecting unit 10D, and performs decoding. The circuit data used in reconfiguration performed by the decoding processor 10C is stored in the circuit data memory 10F.

The output controller 10G controls output of a processing result obtained from the decoding processor 10C. The output controller 10G sequentially outputs the decoded target data obtained from the decoding processor 10C, e.g., image data which has been decoded into raster format, from the top line in the unit of the output width for the decoding processor 10C.

Figure 7:
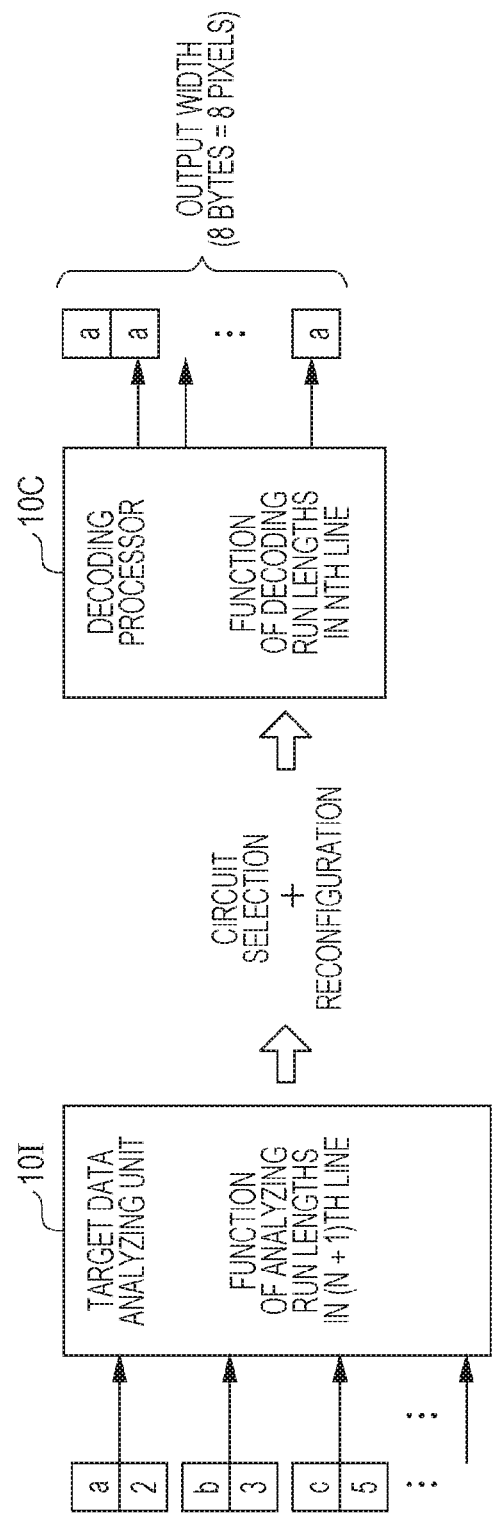
FIG. 7 is a diagram illustrating exemplary processing performed by a target data analyzing unit and a decoding processor.

FIG. 7 is a diagram illustrating an exemplary process performed by the target data analyzing unit 10I and the decoding processor 10C. The target data analyzing unit 10I analyzes the encoded target data by every processing unit. For example, the target data analyzing unit 10I analyzes image data in vector format line by line from the top. The processing unit is not limited to a line. For example, a page or a block may be used as a processing unit. Alternatively, a combination of some lines may be used as a processing unit.

A decoder circuit suitable for the arrangement of run lengths is selected on the basis of the analysis result obtained by the target data analyzing unit 10I. Then, the selected decoder circuit is formed through reconfiguration in the decoding processor 10C. The decoding processor 10C uses the decoder circuit formed through reconfiguration, so as to decode the encoded target data, thereby obtaining the decoded target data. In the example in FIG. 7, the decoding processor 10C sequentially outputs image data whose output width is eight bytes corresponding to eight pixels and which has been decoded into raster format, from the top line in the unit of 8 pixels.

Prior to the decoding performed by the decoding processor 10C, the target data analyzing unit 10I analyzes the target data by every processing unit. For example, in the case where a line is used as a processing unit, in a processing period in which the decoding processor 10C decodes the Nth (N is a natural number) line, the target data analyzing unit 10I analyzes the (N+1)th line which is the next line of the Nth line. Before execution of decoding of the (N+1)th line, for example, just after the decoding of the Nth line is completed, circuit selection and reconfiguration are performed according to the analysis result for the (N+1)th line.

Figure 8:
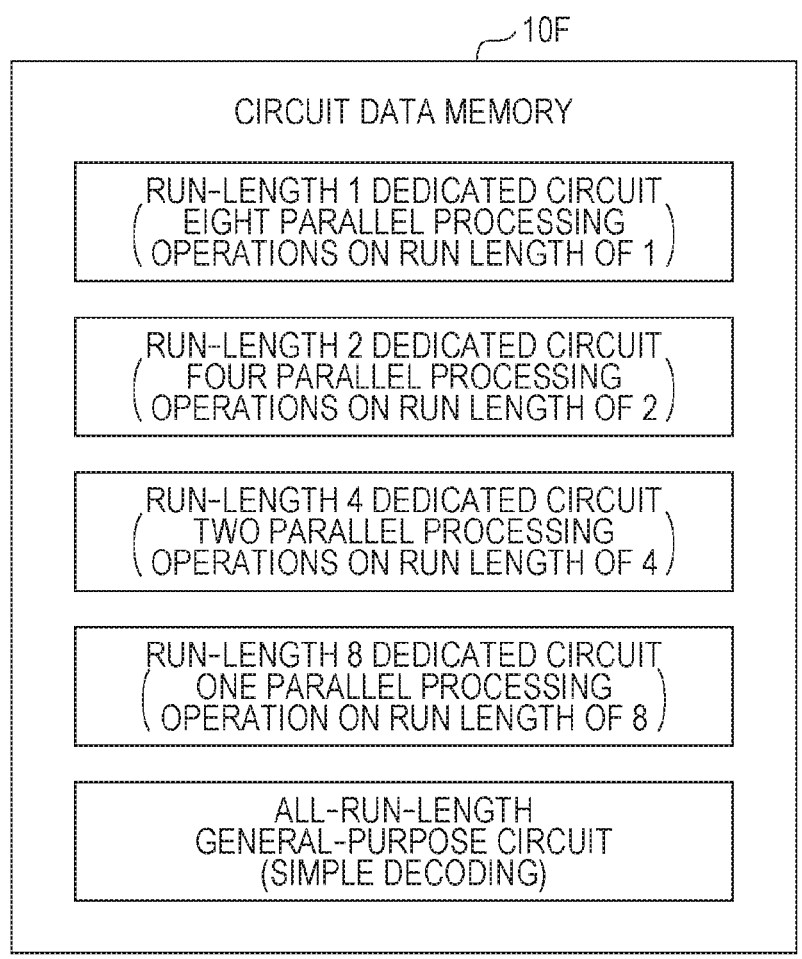
FIG. 8 is a diagram illustrating circuit data of the second example which is stored in the circuit data memory.

FIG. 8 is a diagram illustrating circuit data of the second example which is stored in the circuit data memory 10F. In the second example in FIG. 8, the circuit data memory 10F stores circuit data for multiple dedicated circuits corresponding to multiple typical run lengths, and circuit data for a general-purpose circuit independent of run length.

A run-length 1 dedicated circuit is a circuit that decodes, in parallel, eight pieces of encoded data (encoded image data), each of which has a run length of 1 which is one of the typical run lengths, and that outputs the decoded data (decoded image data) corresponding to eight pixels. For example, in the encoded target data, that is, in the vectorized image data, the run-length 1 dedicated circuit is used for a data part in which pieces of data, each of which has a run length of 1, are continuously arranged, whereby improvement of decoding performance (reduction in decoding time) may be expected.

A run-length 2 dedicated circuit is a circuit that decodes, in parallel, four pieces of encoded data, each of which has a run length of 2 which is one of the typical run lengths, and that outputs the decoded data corresponding to eight pixels. For example, in the encoded target data, that is, in the vectorized image data, the run-length 2 dedicated circuit is used for a data part in which pieces of data, each of which has a run length of 2, are continuously arranged, whereby improvement of decoding performance (reduction in decoding time) may be expected.

A run-length 4 dedicated circuit is a circuit that decodes, in parallel, two pieces of encoded data, each of which has a run length of 4 which is one of the typical run lengths, and that outputs the decoded data corresponding to eight pixels. It is desirable to use the run-length 4 dedicated circuit in a data part in which pieces of data, each of which has a run length of 4, are continuously arranged. A run-length 8 dedicated circuit is a circuit that decodes encoded data of a run length of 8 which is one of the typical run lengths, and that outputs the decoded data corresponding to eight pixels. It is desirable to use the run-length 8 dedicated circuit in a data part in which pieces of data, each of which has a run length of 8, are continuously arranged.

An all-run-length general-purpose circuit is a circuit that decodes (performs simple decoding on) the run lengths in the encoded data one by one, and is capable of processing all types of run lengths.

As a decoder circuit for each data part which is in the target data and in which pieces of data of a typical run length are continuously arranged, the circuit selecting unit 10D (FIG. 6) selects the dedicated circuit for the typical run length or the general-purpose circuit from among the dedicated circuits corresponding to the typical run lengths and the general-purpose circuit independent of run length. The dedicated circuits and the general-purpose circuit are stored in the circuit data memory 10F.

Figure 9:
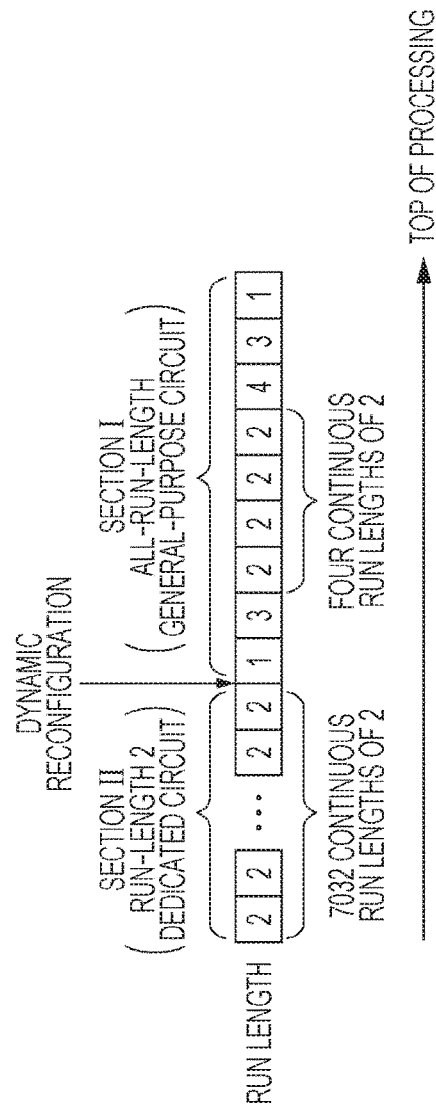
FIG. 9 is a diagram illustrating exemplary circuit selection performed by a circuit selecting unit.

FIG. 9 is a diagram illustrating exemplary circuit selection performed by the circuit selecting unit 10D (FIG. 6). For each data part in which pieces of data of a typical run length are continuously arranged, the circuit selecting unit 10D uses a criteria expression for determining processing performance predicted by using the number of continuous pieces of data, each of which has the typical run length, so as to select the dedicated circuit for the typical run length or the general-purpose circuit. As the criteria expression for determining processing performance, for example, a threshold criteria expression using a threshold and a predicted performance value described below is used.

Expression 1 is such that,
if $\{(A \times n)/N\} + 2\alpha < n$, select the run-length A dedicated circuit, and
if $\{(A \times n)/N\} + 2\alpha \le n$, select the all-run-length general-purpose circuit,
where the expression $\{(A \times n)/N\} + 2\alpha$ represents a predicted performance value, and
the fractional portion of the number of $(A \times n)/N$ is rounded up to an integer.

In Expression 1, A represents a typical run length that is to be analyzed. For example, in the circuit data of the second example illustrated in FIG. 8, the typical run length A is one of 1, 2, 4, and 8. The typical run length is not limited to the values in the second example in FIG. 8, and another run length may be used as a typical run length. The symbol n represents the number of continuous typical run lengths A. The symbol N represents the output width for the decoding processor. For example, in the example in FIG. 7, the output width N is 8. The symbol $\alpha$ represents a dynamic reconfiguration time per reconfiguration.

In the calculation of a predicted performance value in Expression 1, the total time is calculated for the following case: reconfiguration is performed from the general-purpose circuit to a dedicated circuit (reconfiguration time $\alpha$); the dedicated circuit is used to perform decoding (decoding time $(A \times n)/N$); and, after that, reconfiguration is performed from the dedicated circuit to the general-purpose circuit or another dedicated circuit (reconfiguration time $\alpha$). The threshold n in Expression 1 represents the number of continuous typical run lengths A. The threshold n corresponds to a decoding time for the case in which the general-purpose circuit is used to decode all of the typical run lengths A, the number of which is equal to n.

In exemplary analysis 1 in FIG. 9, encoded data (image data in vector format) for which the run length is 14080 is illustrated. For example, in each line in an area in a white frame in image data, if each of the pixel values of all pixels (14080 pixels) constituting the line is 0xff (white), encoded data in exemplary analysis 1 for which the run length is 14080 (the number of pixel values is one) is obtained.

In the circuit data of the second example in FIG. 8, the typical run lengths A are 1, 2, 4, and 8. The run length of 14080 is not a typical run length. Therefore, in exemplary analysis 1 in FIG. 9, the all-run-length general-purpose circuit is selected as a decoder circuit for the data part for which the run length is 14080.

In exemplary analysis 2 in FIG. 9, encoded data (image data in vector format) containing a typical run length of 2 is illustrated.

In a data part in which run lengths having different values are continuously arranged in section I of exemplary analysis 2, that is, in a data part in which run lengths of 1, 3, and 4 are arranged and a data part in which run lengths of 3 and 1 are arranged, no run lengths having the same value are continuously arranged. Therefore, the all-run-length general-purpose circuit is selected as a decoder circuit for these data parts. A run length of 1 and a run length of 4 are used as a typical run length A in the circuit data of the second example in FIG. 8. Therefore, the threshold criteria expression in Expression 1 may be used. In section I of exemplary analysis 2 in FIG. 9, the number of continuous run lengths of 1, n, is one, and the number of continuous run lengths of 4, n, is also one. Therefore, even when the threshold criteria expression in Expression 1 is applied, the all-run-length general-purpose circuit is selected.

For a data part in which four run lengths of 2 are continuously arranged in section I of exemplary analysis 2, the threshold criteria expression in Expression 1 is used. Since four run lengths of 2 (typical run length A=2) are continuously arranged (the number of continuous run lengths, n, =4), if it is assumed that the reconfiguration time $\alpha=5$ (clock), the predicted performance value, $\{(A \times n)/N\}+2\alpha$, =11 (clock). In contrast, the threshold n, that is, a decoding time required for the general-purpose circuit decoding the data part in which four run lengths of 2 are continuously arranged, is obtained as n=5 (clock). Therefore, for the data part in which four run lengths of 2 are continuously arranged in section I of exemplary analysis 2, the all-run-length general-purpose circuit is selected by using the threshold criteria expression in Expression 1. As a result, for all of the data parts in section I of exemplary analysis 2, the all-run-length general-purpose circuit is selected.

In contrast, section II of exemplary analysis 2 in FIG. 9 is constituted by a data part in which 7032 run lengths of 2 are continuously arranged. For this data part, the threshold criteria expression in Expression 1 is used. Since 7032 run lengths of 2 (typical run length A=2) are continuously arranged (the number of continuous run lengths, n, =7032), if it is assumed that the reconfiguration time $\alpha=5$ (clock), the predicted performance value, $\{(A \times n)/N\}+2\alpha$, =1770 (clock). In contrast, the threshold n, that is, the decoding time required for the general-purpose circuit decoding the data part in which 7032 run lengths of 2 are continuously arranged, is obtained as n=7032 (clock). Therefore, for the data part in which 7032 run lengths of 2 are continuously arranged in section II of exemplary analysis 2, the run-length 2 dedicated circuit is selected by using the threshold criteria expression in Expression 1.

Figure 10:
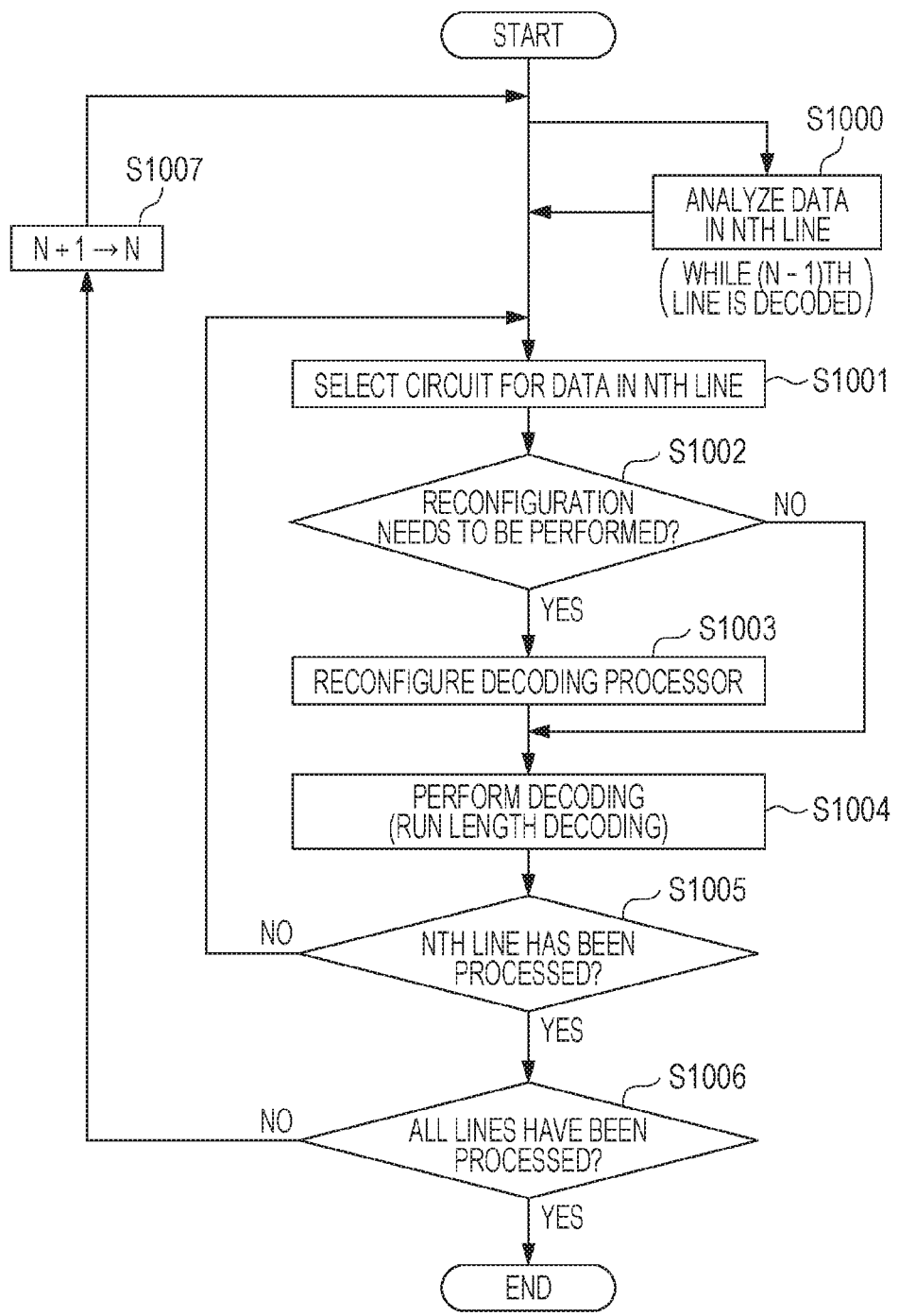
FIG. 10 is a flowchart of a process of the second example which is performed by the data processor.

FIG. 10 is a flowchart of a process performed by the data processor 10 of the second example (FIG. 6). FIG. 10 illustrates an exemplary process in which each line of image data constituted by multiple lines is used as a processing unit.

Prior to the decoding of the Nth line (N is a natural number), the target data analyzing unit 10I analyzes the Nth line (S1000). After the analysis of the Nth line, the processes after S1001 are performed. For the top line (N=1), the analysis performed in S1000 may be skipped, and all of the data parts in the line may be simply decoded by using the all-run-length general-purpose circuit (FIG. 8). While the previous line (the (N−1)th line) is being decoded, the second line (N=2) and the subsequent lines may be analyzed in parallel with the decoding.

The circuit selecting unit 10D performs circuit selection on the Nth line on the basis of the analysis result (the number of continuous typical run lengths) for the Nth line which is obtained by the target data analyzing unit 10I (S1001). That is, the circuit selection described by using FIGS. 8 and 9 is performed, and it is determined which circuit is to be used for which data part in the Nth line.

It is checked whether or not reconfiguration needs to be performed (S1002), and the decoding processor 10C decodes the Nth line. For example, for a data part in the Nth line which requires reconfiguration, a circuit selected by the circuit selecting unit 10D is formed through reconfiguration in the decoding processor 10C (S1003), and the decoding processor 10C uses the circuit formed through reconfiguration, so as to perform decoding (S1004). In contrast, for a data part in the Nth line which does not require reconfiguration, reconfiguration is not performed in the decoding processor 10C. The current circuit is maintained, and the decoding processor 10C performs decoding (S1004).

The processes from S1001 to S1004 are repeatedly performed until all of the data parts in the Nth line have been decoded (S1005). If all of the data parts in the Nth line have been decoded, it is checked whether or not all of the lines in the image data have been decoded (S1006). If all of the lines have not been decoded, N is updated to N+1 (S1007), and the next line, i.e., the Nth line (N has been updated), is processed. If all of the lines in the image data have been decoded (S1006), the flowchart in FIG. 10 is ended.

Figure 11:
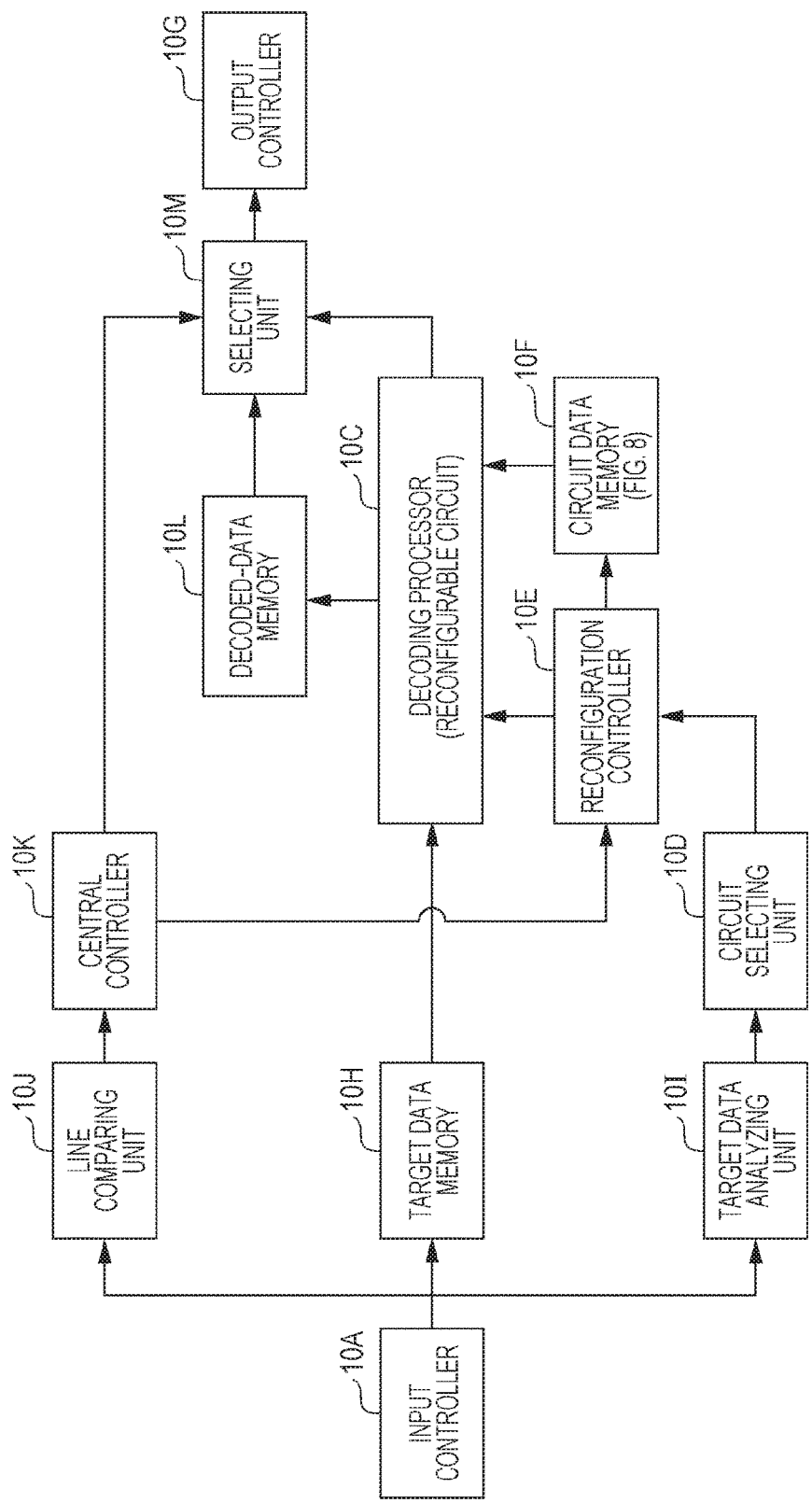
FIG. 11 is a diagram illustrating a data processor of a third example.

FIG. 11 is a diagram illustrating the data processor 10 of a third example. FIG. 11 illustrates an exemplary internal configuration of the data processor 10.

Comparing with the second example in FIG. 6, a line comparing unit 10J, a central controller 10K, a decoded-data memory 10L, and a selecting unit 10M are added in the third example in FIG. 11. In the configuration in FIG. 11, components designated with the same reference characters as those in FIG. 6 are provided with the same functions as those in the second example and performs the same processes as those in the second example. While the components added in FIG. 11 are focused on, the data processor 10 of the third example will be described.

The encoded target data, e.g., image data in vector format constituted by multiple lines, is sequentially transmitted to the target data memory 10H, the target data analyzing unit 10I, and the line comparing unit 10J from the top line. The line comparing unit 10J compares the data in the Nth line (N is a natural number) with the data in the previous line (the (N−1)th line).

If the data in the Nth line does not match the data in the (N−1)th line, decoding of the Nth line needs to be performed. The central controller 10K controls the reconfiguration controller 10E and the like to decode the Nth line. That is, circuit selection is performed in accordance with the analysis result for the Nth line. Reconfiguration is performed in the decoding processor 10C if necessary, and the Nth line is decoded (see FIGS. 7 to 10). A result of the processing result obtained by the decoding processor 10C, e.g., image data which has been decoded into raster format, is selected by the selecting unit 10M, and is output to the output controller 10G.

In contrast, if the data in the Nth line matches the data in the (N−1)th line, decoding of the Nth line does not need to be performed. The central controller 10K controls the selecting unit 10M so that the result of decoding of the (N−1) line which is stored in the decoded-data memory 10L is transmitted to the output controller 10G as a result of decoding of the Nth line. For example, the result of decoding of the (N−1)th line which is stored in the decoded-data memory 10L (image data in raster format) is sequentially read in such a manner that each piece of the read data has the same data width as the output width for the decoding processor 10C, and is output from the output controller 10G via the selecting unit 10M.

In the third example in FIG. 11, in the case where the data in the Nth line matches the data in the (N−1)th line, decoding of the Nth line is skipped. Therefore, comparing the case in which the Nth line is decoded, the processing time is reduced and the circuit power consumption is also reduced.

Figure 12:
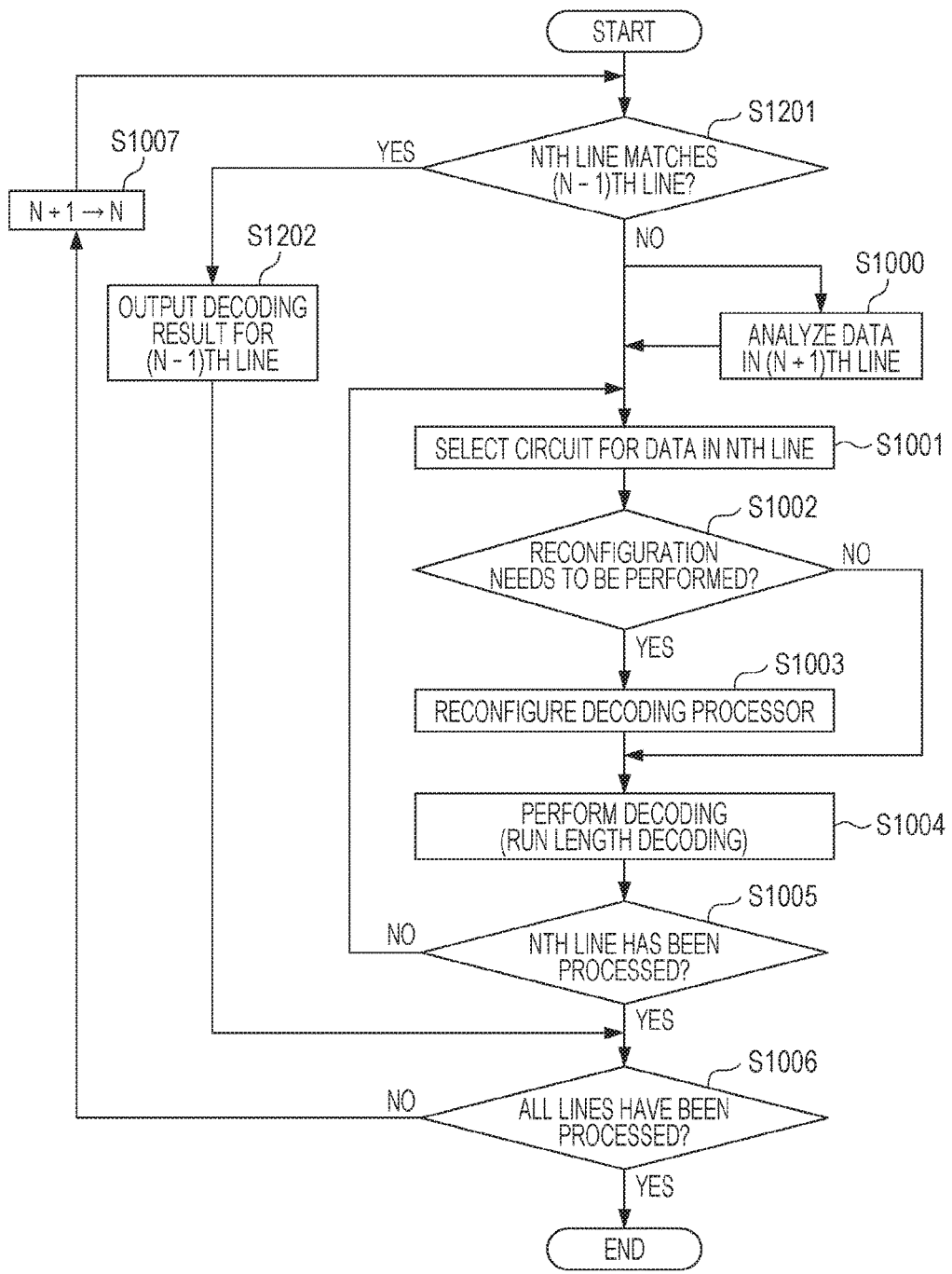
FIG. 12 is a flowchart of a process of the third example which is performed by the data processor.

FIG. 12 is a flowchart of a process performed by the data processor 10 of the third example (FIG. 11). FIG. 12 illustrates an exemplary process in which each line of image data constituted by multiple lines is used as a processing unit.

When the Nth line (N is a natural number) is to be processed, the line comparing unit 10J checks whether or not the data in the Nth line matches the data in the (N−1)th line (S1201). For the top line (N=1), the checking operation in S1201 is skipped, and the processes after S1000 are performed.

In the checking operation in S1201, if the data in the Nth line matches the data in the (N−1)th line, the result of decoding of the (N−1)th line which is stored in the decoded-data memory 10L is output from the output controller 10G (S1202). It is checked whether or not all of the lines in the image data have been decoded (S1006). If all of the lines have not been decoded, N is updated to N+1 (S1007), and the next line, i.e., the Nth line (N has been updated), is processed.

In contrast, in the checking operation in S1201, if the data in the Nth line does not match the data in the (N−1)th line, decoding of the Nth line needs to be performed, and the processes from S1000 to S1005 which are described by using FIG. 10 are performed. The processes from S1000 to S1005 are described, and the description will not be made. When all of the lines in the image data have been decoded (S1006), the flowchart in FIG. 12 is completed.

The desirable exemplary embodiment of the present invention is described above. The above-described embodiment is merely an example in all respects, and does not limit the scope of the present invention. The present invention encompasses various modified exemplary embodiments without departing from the gist of the present invention.

What is claimed is:

1. A data processing apparatus comprising:
    a circuit selecting unit configured to select a decoder circuit for each data part of encoded target data, the decoder circuit being suitable for an arrangement of run lengths in the data part; and
    a decoding processor configured to perform reconfiguration forming the decoder circuit selected for the data part, and to decode the target data,
    wherein the decoding processor is further configured to determine whether to perform the reconfiguration in response to a comparison of a first time to perform the reconfiguration and to decode the target data and a second time to decode the target data without performing the reconfiguration.

2. The data processing apparatus according to claim 1,
    wherein the circuit selecting unit is further configured to select the decoder circuit for the data part from among a plurality of dedicated circuits outputting processing results having an identical output width.

3. The data processing apparatus according to claim 2,
    wherein the circuit selecting unit is further configured to select a dedicated circuit as the decoder circuit for the data part from among the plurality of dedicated circuits, each of the plurality of dedicated circuits being prepared for a corresponding one of combinations of run lengths, a total of the run lengths being equal to the output width, the selected dedicated circuit being associated with a combination of the run lengths in the data part.

4. The data processing apparatus according to claim 1,
    wherein the circuit selecting unit is further configured to select the decoder circuit for the data part in which identical run lengths are continuously arranged in the encoded target data, the selection being performed by using the number of continuous, identical run lengths in the data part as an index.

5. The data processing apparatus according to claim 4,
    wherein the circuit selecting unit is further configured to select a dedicated circuit or a general-purpose circuit as the decoder circuit for the data part from among a plurality of circuits, the plurality of circuits including a plurality of dedicated circuits and the general-purpose circuit, the plurality of dedicated circuits corresponding to a plurality of typical run lengths, the general-purpose circuit being independent of run length, the data part being a part in which a typical run length among the plurality of typical run lengths is continuously arranged in the target data, the selected dedicated circuit being prepared for the typical run length.

6. The data processing apparatus according to claim 5,
    wherein the circuit selecting unit is further configured to select the dedicated circuit or the general-purpose circuit for the data part, the data part being a part in which the typical run length is continuously arranged, the selection being performed by using an expression for determining processing performance predicted by using the number of continuous, typical run lengths in the data part, the selected dedicated circuit being prepared for the typical run length.

7. The data processing apparatus according to claim 1, further comprising:
    a memory configured to store a decoding result for each line of a plurality of lines constituting the target data; and
    a controller configured to output, as a decoding result for a first line, a decoding result for a second line, the first line containing data matching data contained by the second line, the second line having been decoded, the decoding result for the second line being stored in the memory.

8. The data processing apparatus according to claim 2, further comprising:
    a memory configured to store a decoding result for each line of a plurality of lines constituting the target data; and
    a controller configured to output, as a decoding result for a first line, a decoding result for a second line, the first line containing data matching data contained by the second line, the second line having been decoded, the decoding result for the second line being stored in the memory.

9. The data processing apparatus according to claim 3, further comprising:
  a memory configured to store a decoding result for each line of a plurality of lines constituting the target data; and
  a controller configured to output, as a decoding result for a first line, a decoding result for a second line, the first line containing data matching data contained by the second line, the second line having been decoded, the decoding result for the second line being stored in the memory.

10. The data processing apparatus according to claim 4, further comprising:
  a memory configured to store a decoding result for each line of a plurality of lines constituting the target data; and
  a controller configured to output, as a decoding result for a first line, a decoding result for a second line, the first line containing data matching data contained by the second line, the second line having been decoded, the decoding result for the second line being stored in the memory.

11. The data processing apparatus according to claim 5, further comprising:
  a memory configured to store a decoding result for each line of a plurality of lines constituting the target data; and
  a controller configured to output, as a decoding result for a first line, a decoding result for a second line, the first line containing data matching data contained by the second line, the second line having been decoded, the decoding result for the second line being stored in the memory.

12. The data processing apparatus according to claim 6, further comprising:
  a memory configured to store a decoding result for each line of a plurality of lines constituting the target data; and
  a controller configured to output, as a decoding result for a first line, a decoding result for a second line, the first line containing data matching data contained by the second line, the second line having been decoded, the decoding result for the second line being stored in the memory.

13. A non-transitory computer readable medium storing a program causing a computer to execute a process comprising:
  selecting a decoder circuit for each data part of encoded target data, the decoder circuit being suitable for an arrangement of run lengths in the data part;
  controlling a reconfigurable circuit in such a manner that reconfiguration is performed and forms the decoder circuit selected for the data part and that the target data is decoded; and
  determining to perform the reconfiguration in response to a comparison of a first time to perform the reconfiguration and to decode the target data and a second time to decode the target data without performing the reconfiguration.

14. A data processing method comprising:
  selecting a decoder circuit for each data part of encoded target data, the decoder circuit being suitable for an arrangement of run lengths in the data part;
  controlling a reconfigurable circuit in such a manner that reconfiguration is performed and forms the decoder circuit selected for the data part and that the target data is decoded; and
  determining to perform the reconfiguration in response to a comparison of a first time to perform the reconfiguration and to decode the target data and a second time to decode the target data without performing the reconfiguration.

15. The data processing apparatus according to claim 1, wherein
  the decoding processor is configured to perform the reconfiguration in response to determining that $$\frac{A \cdot n}{N} + 2\alpha < n,$$

where A is a run length of the run lengths in the data part, n is a number of continuous A in the data part, N represents an output width of the decoding processor, and $\alpha$ is a dynamic reconfiguration time per the reconfiguration.

16. The data processing apparatus according to claim 15, wherein
  the decoding processor is configured to decode the target data using an all-run-length general purpose circuit in response to determining that $$\frac{A \cdot n}{N} + 2\alpha \geq n.$$

17. A data processing apparatus comprising:
  a circuit selecting unit configured to select a decoder circuit for each data part of encoded target data, the decoder circuit being suitable for an arrangement of run lengths in the data part; and
  a decoding processor configured to perform reconfiguration to form the decoder circuit selected for the data part, and to decode the target data, wherein
  the circuit selecting unit is further configured to select the decoder circuit for the data part from among a plurality of dedicated circuits outputting processing results having an identical output width.

18. A data processing apparatus comprising:
  a circuit selecting unit configured to select a decoder circuit for each data part of encoded target data, the decoder circuit being suitable for an arrangement of run lengths in the data part; and
  a decoding processor configured to perform reconfiguration to form the decoder circuit selected for the data part, and to decode the target data, wherein
  the circuit selecting unit is further configured to select the decoder circuit for the data part in which identical run lengths are continuously arranged in the encoded target data, the selection being performed by using the number of continuous, identical run lengths in the data part as an index.

19. A data processing apparatus comprising:
  a circuit selecting unit configured to select a decoder circuit for each data part of encoded target data, the decoder circuit being suitable for an arrangement of run lengths in the data part;
  a decoding processor configured to perform reconfiguration to form the decoder circuit selected for the data part, and to decode the target data;
  a memory configured to store a decoding result for each line of a plurality of lines constituting the target data; and a controller configured to output, as a decoding result for a first line, a decoding result for a second line, the first line containing data matching data contained by the second line, the second line having been decoded, the decoding result for the second line being stored in the memory.

* * * * *